(12) United States Patent
Nakamura et al.

(10) Patent No.: US 10,100,399 B2
(45) Date of Patent: Oct. 16, 2018

(54) CATHODE ASSEMBLY

(71) Applicant: ULVAC, INC., Kanagawa (JP)

(72) Inventors: Shinya Nakamura, Kanagawa (JP); Hiroki Yamamoto, Kanagawa (JP)

(73) Assignee: ULVAC, INC., Kanagawa (JP)

(*) Notice: Subject to any disclaimer, the term of this patent is extended or adjusted under 35 U.S.C. 154(b) by 0 days.

(21) Appl. No.: 15/507,816

(22) PCT Filed: Mar. 15, 2016

(86) PCT No.: PCT/JP2016/001461
§ 371 (c)(1),
(2) Date: Mar. 1, 2017

(87) PCT Pub. No.: WO2016/157771
PCT Pub. Date: Oct. 6, 2016

(65) Prior Publication Data
US 2017/0283941 A1 Oct. 5, 2017

(30) Foreign Application Priority Data
Mar. 31, 2015 (JP) .................................. 2015-071607

(51) Int. Cl.
C23C 14/34 (2006.01)
H01J 37/34 (2006.01)

(52) U.S. Cl.
CPC ...... *C23C 14/3407* (2013.01); *H01J 37/3423* (2013.01); *H01J 37/3426* (2013.01); *H01J 37/3491* (2013.01)

(58) Field of Classification Search
CPC .............. C23C 14/3407; H01J 37/3435; H01J 37/3423; H01J 37/3491
(Continued)

(56) References Cited

U.S. PATENT DOCUMENTS 9,633,824 B2 * 4/2017 Nguyen .............. H01J 37/3423
2005/0170263 A1 * 8/2005 Mitsui ................. C23C 14/0641
430/5

FOREIGN PATENT DOCUMENTS

JP 63-297554 A 12/1988
JP 2001-316798 A 11/2001
(Continued)

OTHER PUBLICATIONS

Machine Translation to Kimura (JP 2009-187682) published Aug. 2009. (Year: 2009).*

(Continued)

*Primary Examiner* — John J Brayton
(74) *Attorney, Agent, or Firm* — Cermak Nakajima & McGowan LLP; Tomoko Nakajima

(57) ABSTRACT

A cathode assembly is provided in which, while preventing the occurrence of abnormal electric discharging between a projected portion of a backing plate and a side surface of a target, particles can be prevented from being generated. The cathode assembly for a sputtering apparatus of this invention has: a target made of an insulating material; a backing plate bonded to one surface of the target; and, where such a side of the backing plate as is on the side of the target is defined as a lower side, an annular shield plate disposed to lie opposite to the lower side of that projected portion of the backing plate which is projected outward beyond an outer peripheral end of the target. The cathode assembly has a bonding portion arranged to be protruded relative to the projected portion. An inner peripheral edge portion of the shield plate is positioned in a clearance between that extended portion of the target which is extended outward beyond the bonding portion in a state in which the target is kept bonded to the bonding portion, and the projected portion of the backing plate.

5 Claims, 3 Drawing Sheets

(58) Field of Classification Search
USPC .................................................. 204/298.12
See application file for complete search history.

(56) References Cited

FOREIGN PATENT DOCUMENTS

| JP | 2001316798 A | * | 11/2001 |
| JP | 2009-187682 A | | 8/2009 |
| JP | 2010-255052 A | | 11/2010 |
| JP | 2015-030858 A | | 2/2015 |

OTHER PUBLICATIONS

Translation to Kosaka (JP 2001-316798) published Nov. 2001. (Year: 2001).*
International Search Report and Written Opinion for PCT Patent App. No. PCT/JP2016/001461 (dated May 24, 2016) with English translation of the ISR.

* cited by examiner

CATHODE ASSEMBLY

This application is a national phase entry under 35 U.S.C. § 371 of PCT Patent Application No. PCT/JP2016/001461, filed on Mar. 15, 2016, which claims priority under 35 U.S.C. § 119 to Japanese Patent Application No. 2015-071607, filed Mar. 31, 2015, both of which are incorporated by reference.

TECHNICAL FIELD

The present invention relates to a cathode assembly for use in a sputtering apparatus and relates, in more detail, to a cathode assembly comprising: a target made of an insulating material; a backing plate bonded to one surface of the target; and, where such a side of the backing plate as is on the side of the target is defined as a lower side, an annular shield plate disposed to lie opposite to the lower side of that projected portion of the backing plate which is projected outward beyond an outer peripheral end of the target.

BACKGROUND ART

For example, in the processes of manufacturing a NAND flush memory or a MRAM (magneto-resistive random-access memory), processes of forming insulating films such as aluminum oxide films, magnesium oxide films, and the like are carried out. Sputtering apparatus is used in order to form insulating films with good productivity. In this kind of sputtering apparatus, there is assembled a cathode assembly inside a vacuum chamber that is capable of being evacuated, the cathode assembly having: a target appropriately selected depending on the composition of the thin film to be formed; a backing plate for cooling the target at the time of film forming by sputtering; and an annular shield plate which is disposed to lie opposite to the lower side of that projected portion of the backing plate which is projected outward beyond an outer peripheral end of the target.

This kind of cathode assembly is known, e.g., in Patent Document 1. According to this arrangement, the backing plate is formed of metal such as copper with good thermal conduction, and has a projected portion projected outward beyond an outer peripheral end. This projected portion is fixed to a predetermined position of the sputtering apparatus. In addition, after having assembled the backing plate to the sputtering apparatus, an annular shield plate is generally disposed in a manner to lie opposite to the projected portion in order to stabilize the electric discharging, and the like purpose.

By the way, in an example like the conventional one, in a state in which the cathode assembly is assembled to the sputtering apparatus, there is a clearance between the target and the shield plate. When plasma is caused to be generated inside the vacuum chamber during film forming, the electrons in the plasma will sometimes be electrically charged to the projected portion through the clearance. When the electrons get electrically charged to the projected portion, since the target is an insulating material, there will be generated abnormal discharging due to electric potential difference between the side surface of the target and the projected portion.

It is proposed, e.g., in Patent Document 2, that the outer peripheral portion of the target be covered with a shield plate so that the electrons in the plasma do not get charged in the projected portion. However, since the shield plate is disposed on the side of the plasma (on the side of the substrate) of the target, a so-called re-deposition film will be formed as a result of re-deposition of the sputtered particles by their turning around into the clearance between the outer peripheral portion of the target and the shield plate. There is a problem in that, since this re-deposition film is weak in adhesive force, it will easily be peeled off from the target and therefore that the particles will be generated.

PRIOR ART DOCUMENTS

Patent Documents

Patent Document 1: JP-2010-255052 A
Patent Document 2: JP-2009-187682 A

SUMMARY OF THE INVENTION

Problems that the Invention is to Solve

In view of the above points, this invention has a problem of providing a cathode assembly which is capable of preventing abnormal discharging from being generated between the projected portion of the backing plate and the side surface of the target, and which is also capable of preventing the particles from being generated.

Means of Solving the Problems

In order to solve the above problems, there is provided a cathode assembly comprising: a target made of an insulating material; a backing plate bonded to one surface of the target; and, where such a side of the backing plate as is on the side of the target is defined as a lower side, an annular shield plate disposed to lie opposite to the lower side of that projected portion of the backing plate which is projected outward beyond an outer peripheral end of the target. The cathode assembly is characterized in: that the backing plate has a bonding portion arranged to be protruded relative to the projected portion; and that an inner peripheral edge portion of the shield plate is positioned in a clearance between that extended portion of the target which is extended outward beyond the bonding portion in a state in which the target is kept bonded to the bonding portion, and the projected portion of the backing plate.

According to this invention, since an arrangement has been employed in which the inner peripheral edge portion of the shield plate is positioned in a clearance between the extended portion of the target and the extended portion of the backing plate, when plasma is generated between the target and the substrate, there is no clearance between the target and the shield plate for the plasma to be able to face the projected portion. The electrons in the plasma can thus be prevented from getting charged in the projected portion of the backing plate so as to induce abnormal discharging. In addition, since the shield plate is disposed on an upper side of the target, as compared with a conventional example in which the shield plate is disposed on the lower side of the target, the sputtered particles become harder to get turned into the clearance between the target and the shield plate. As a result, forming of a re-deposited film can be restrained and the generation of the particles can be restrained.

In this invention, preferably the shield plate is divisible into a plurality of portions. According to this arrangement, the shield plate can be attached or detached in a state in which the target is kept bonded to the bonding portion of the backing plate.

In this invention, preferably the length of the portion in which the extended portion of the target and the shield plate lie opposite to each other in an overlapped manner is above a thickness of the target. Further, the inner peripheral edge portion of the shield plate shall preferably be positioned, within the clearance, in a position closer to the bonding portion than an intermediate point of the extended portion of the target. According to this arrangement, the sputtered particles get hardly turned into the clearance between the target and the shield plate.

Still furthermore, in this invention, the length of the clearance between the shield plate and the backing plate, and the length of the clearance between the shield plate and the target shall preferably be set to a range of 0.5 mm through 2 mm, respectively.

MODES FOR CARRYING OUT THE INVENTION

With reference to the accompanying drawings, description will be made of a cathode assembly according to an embodiment of this invention by taking an example which is assembled to a sputtering apparatus. In the following description, the side of the ceiling portion of the vacuum chamber 1 is defined as "top or upper", and the bottom side thereof is defined as "bottom or lower" with FIG. 1 serving as a standard.

Figure 1:
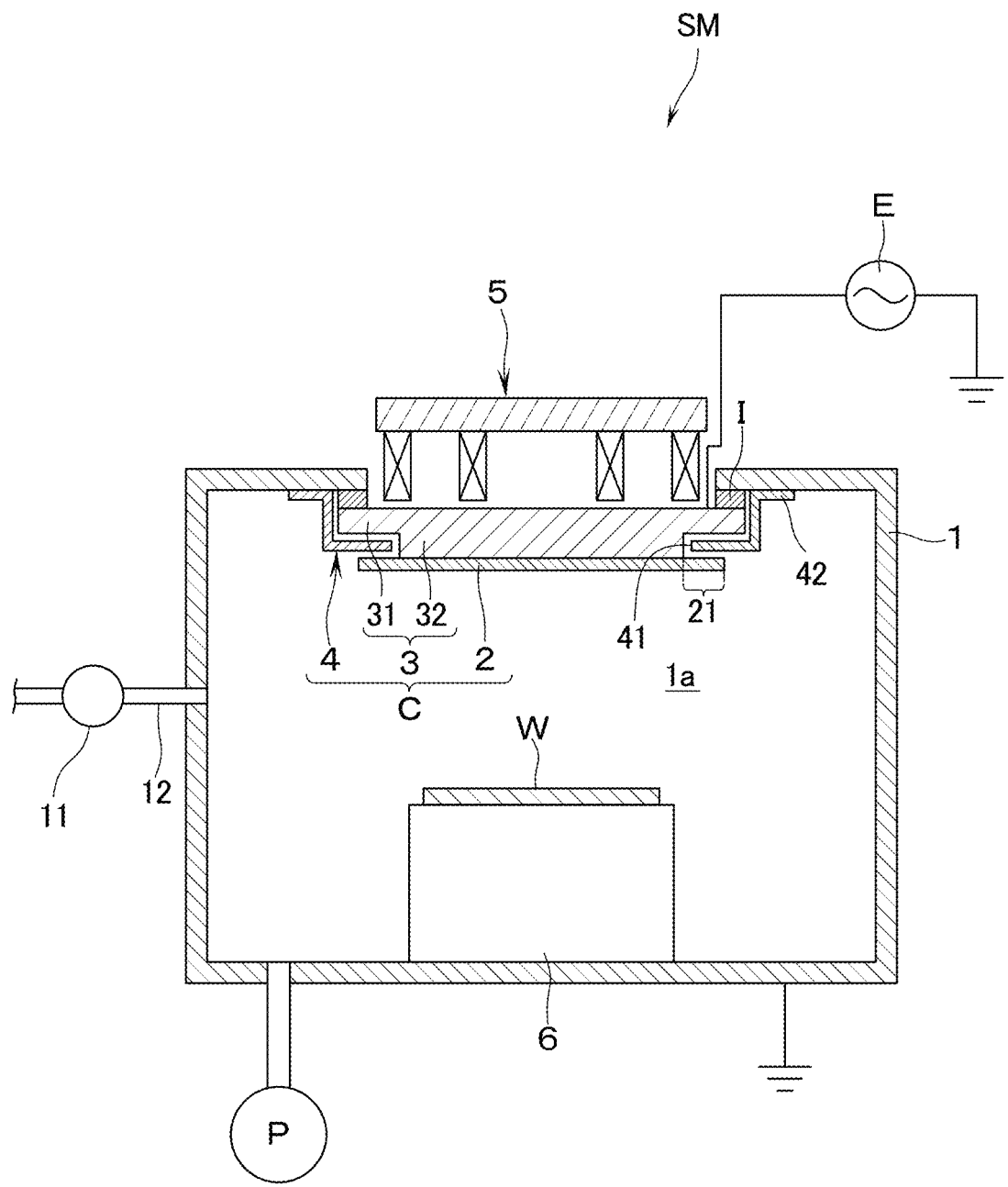
FIG. 1 is a schematic sectional view of a sputtering apparatus in which a cathode assembly according to an embodiment of this invention has been assembled.

As shown in FIG. 1, the sputtering apparatus SM is provided with a vacuum chamber 1 which defines a processing chamber 1a. To the bottom portion of the vacuum chamber 1, there is connected, through an exhaust pipe, a vacuum pump P which is made up of a turbo molecular pump, a rotary pump, and the like. It is thus so arranged that the vacuum chamber 1 can be evacuated to a predetermined pressure (e.g., $1 \times 10^{-5}$ Pa). To the side wall of the vacuum chamber 1, there is connected a gas pipe 12 which is communicated with a gas source (not illustrated) and which has interposed therein a mass flow controller 11. It is thus so arranged that a sputtering gas made up of a rare gas such as Ar can be introduced into the processing chamber 1a at a predetermined flow rate.

At the ceiling portion of the vacuum chamber 1, there is disposed a cathode unit C. The cathode unit C has: a target 2 made of an insulating material such as $Al_2O_3$ and the like to be appropriately selected depending on the composition of the thin film to be formed; a backing plate 3 bonded to one surface (upper surface in this embodiment) of the target 2; and an annular and ground-potential shield plate 4 disposed to lie opposite to the lower side of that projected portion 31 of the backing plate 3 which is projected outward and also horizontally beyond an outer peripheral end of the target 2.

The backing plate 3 is made of metal having good thermal conductivity such as Cu and the like, and has a bonding portion 32 protruded downward relative to the above-mentioned projected portion 31. To the lower side of this bonding portion 32, there is bonded the above-mentioned target 2 through a bonding material such as indium, zinc, and the like. In the backing plate 3 there is formed a passage for a coolant (not illustrated). It is thus so arranged that, by allowing the coolant (e.g., cooling water) to flow through the passage for the coolant, the target 2 can be cooled during sputtering. The target 2 has connected thereto an output from a HF power source having a known construction as a sputtering power source E and, during sputtering, AC power is applied.

A magnet unit 5 is disposed above the backing plate 3. As the magnet unit 5 there may be used one having a known construction in which: a magnetic field is generated in a space below the lower surface (sputtering surface) of the target 2; the electrons and the like that are electrolytically dissociated below the sputtering surface at the time of sputtering are captured; and the sputtered particles scattered from the target 2 are efficiently ionized. Therefore, detailed description thereof is omitted here.

Figure 2:
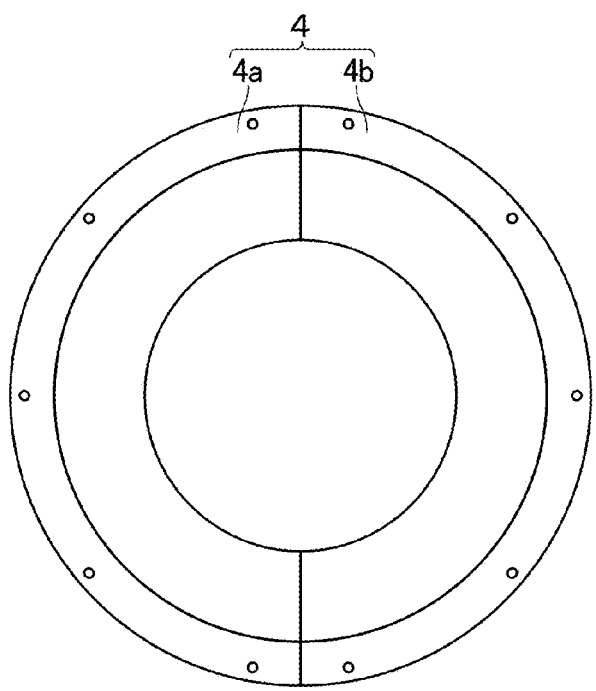
FIG. 2 is a plan view (i.e., a view as seen from top) showing the shield plate of the cathode assembly.

The projected portion 31 of the backing plate 3 is attached to an upper wall of the vacuum chamber 1 through an insulating material I. A flange portion 42 provided along an outer peripheral edge portion of the shield plate 4 is fixed to the upper wall of the vacuum chamber 1 by means of bolts and nuts and the like (not illustrated). At this time, as shown in FIG. 2, if the shield plate 4 is arranged to be capable of being divided into a plurality of (two in this embodiment) parts 4a, 4b, the shield plate 4 (4a, 4b) can be attached or detached to and from the bonding portion 32 of the backing plate 3 in a state in which the target 2 is kept bonded to the bonding portion 32 of the backing plate 3.

Figure 3:
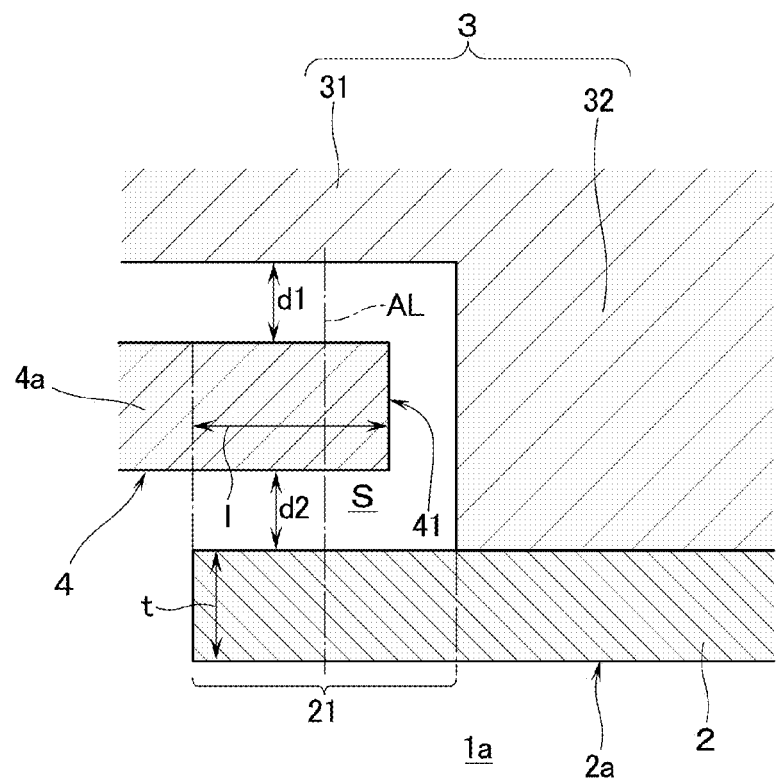
FIG. 3 is a sectional view showing in enlargement the position of the inner peripheral edge portion of the cathode assembly.

If the cathode unit C is assembled, in this manner, to the vacuum chamber 1, with reference also to FIG. 3, the inner peripheral edge portion 41 of the shield plate 4 can be positioned in a clearance S between: that extended portion 21 of the target 2 which extends outward from the bonding portion 32 in a state in which the target 2 is kept (or remains) bonded to the bonding portion 32; and the projected portion 31 of the backing plate 3. When the stability and the like of electrostatic discharging is taken into consideration, it is preferable to set: the length d1 of clearance between: the shield plate 4 and the backing plate 3; and the length d2 of clearance between the shield plate 4 and the target 2 to be set, e.g., to a range of 0.5 through 2 mm, respectively. Further, in order to make it difficult for the sputtered particles to turn around into the clearance between the target 2 and the shield plate 4, the length 1 of the portion in which the extended portion 21 of the target 2 and the shield plate 4 are overlapped with, and lie opposite to, each other shall preferably be above the thickness (e.g., 5 mm) of the target 2. In addition, the inner peripheral edge portion 41 of the shield plate 4 shall preferably be positioned, in the clearance between the extended portion 21 and the projected portion 31, on the side toward the bonding portion 32 of the intermediate point of the extended portion 21 as shown in an auxiliary line AL.

At the bottom portion of the vacuum chamber 1, there is disposed a stage 6 in a manner to lie opposite to the sputtering surface 2a of the target 2. It is thus so arranged that a substrate W is aligned and held in position with the film-forming surface thereof lying on the upper side. Though not particularly illustrated, the above-mentioned sputtering apparatus SM comprises a known control means provided with a microcomputer, sequencer, and the like. It is thus so arranged that an overall control can be made, by the control means, of the operation of the sputtering power source E, of the operation of the mass flow controller 11, of the operation of the vacuum pump P, and the like. Description will now be made of a method of forming an aluminum oxide film on the surface of the substrate W by using the sputtering apparatus SM in which the above-mentioned cathode assembly C has been assembled.

First, after setting the substrate W on the stage 6 inside the vacuum chamber 1, the vacuum pump P was operated to evacuate the processing chamber 1a to a predetermined vacuum degree (e.g., $1\times10^{-5}$ Pa). When the inside of the vacuum chamber 1a reached the predetermined pressure, the mass flow controller 11 was controlled to introduce argon gas at a predetermined flow rate (at this time, the pressure in the processing chamber 1a attains a range between 0.01 through 30 Pa). Together with the above, AC power (e.g., 13.56 MHz, 2000 W) was applied from the sputtering power source E to the target 2 made of $Al_2O_3$ to thereby form a plasma inside the vacuum chamber 1. According to these operations, the sputtering surface 2a of the target 2 got sputtered, and the scattered sputtering particles got adhered to, and deposited on, the surface of the substrate W, thereby forming an aluminum oxide film.

According to this embodiment, since the inner peripheral edge portion 41 of the shield plate 4 was positioned in a space between the extended portion 21 of the target 2 and the projected portion 31 of the backing plate 3, there was no clearance between the target 2 and the shield plate 4 for the plasma to face the projected portion 31. Therefore, the electrons in the plasma can be prevented from getting statically built up in the projected portion 31 to thereby induce the abnormal discharging to occur. In addition, since the shield plate 4 is disposed above the target 2, as compared with a conventional example in which the shield plate 4 is disposed below the target 2, the sputtered particles get hardly turn around into the clearance between the target 2 and the shield plate 4. In other words, a re-deposition film gets hardly formed on the shield plate 4 that lies opposite to the above-mentioned clearance. As a result, generation of particles can be restricted.

Description has so far been made of the embodiment of this invention, but this invention shall not be limited to the above. As the material for the target 2, aluminum oxide was cited as an example. But, without being limited to the above, other insulating material such as SiC, SiN, MgO may appropriately be selected. Further, the shape of the shield plate 4 need not be limited to the one as described in the embodiment. Any shape is acceptable as long as the inner peripheral edge portion of the shield plate can be positioned in the clearance between the extended portion 21 of the target 2 and the projected portion 31 of the backing plate 3.

Figure 4A:
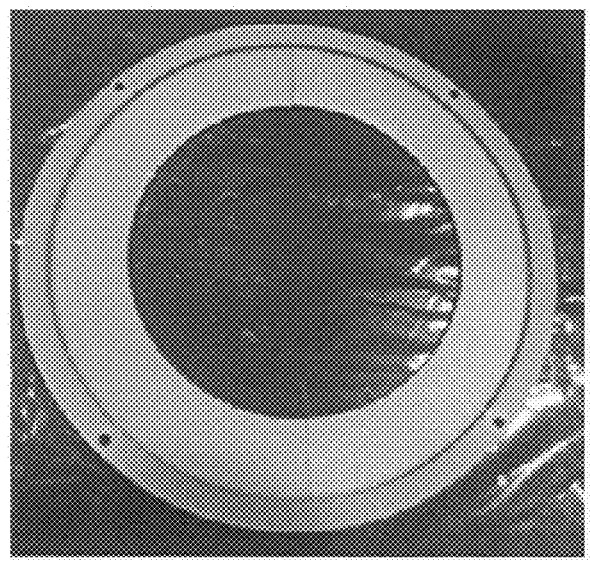
FIGS. 4A and 4B are photographs showing the results of experiments to confirm the effects of this invention.
Figure 4B:
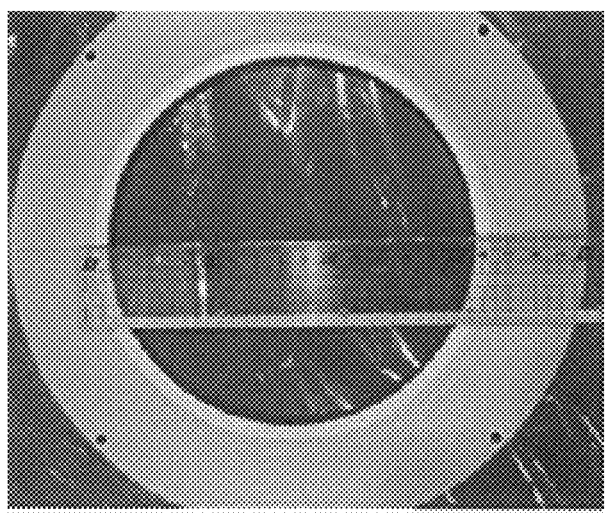

Next, in order to confirm the above-mentioned effects, the following experiments were carried out by using the sputtering apparatus SM having assembled the above-mentioned cathode assembly C. In these experiments, as the substrate W, a Si substrate of ϕ200 mm (in diameter) was used. As the cathode assembly C there was used one having a target of ϕ165 mm (in diameter) made of aluminum oxide, a backing plate 3 made of copper, and a shield plate 4 made of SUS (stainless steel). This cathode assembly C was assembled onto an inner surface of the upper wall of the vacuum chamber 1. After setting the substrate W in position on the stage 6 inside the vacuum chamber 1, an aluminum oxide film was formed on the surface of the substrate W by sputtering method. By using the following film forming conditions, continuous processing (continuous electric discharging) was carried out toward a plurality of substrates W. In other words, the film forming conditions were: argon gas flow rate of 50 sccm (pressure inside the processing chamber of 0.1 Pa); and applied power to the target of 13.56 MHz, 500 W. During film forming under these film forming conditions, Vdc (corresponding to the electric potential difference between the projected portion 31 and the target 2) was measured and confirmed that Vdc had not been generated. When the cathode assembly C was confirmed after 4 kWh, there were found no traces of abnormal discharging (uniform black points). Judging from these results, it has been found that the electrons in the plasma were prevented from being electrostatically charged in the projected portion 31. In addition, upon observation of the front surface and the rear surface of the shield plate 4, as shown in FIGS. 4A and 4B, it has been found that film formation of re-deposited films, particularly, on those portions of the shield plate 4 which were covered by the target 2 was almost zero, thereby preventing the generation of the particles.

EXPLANATION OF REFERENCE CHARACTERS

SM sputtering apparatus
C cathode assembly
2 target made of an insulating material
21 extended portion of the target
3 backing plate
31 projected portion
32 bonding portion
4 (4a, 4b) shield plate
41 inner peripheral edge portion
l length of a portion in which the extended portion 21 and the shield plate 4 are overlapped with, and lie opposite to, each other

The invention claimed is:

1. A cathode assembly comprising:
   a target made of an insulating material;
   a backing plate bonded to one surface of the target; and,
   where such a side of the backing plate as is on the side of the target is defined as a lower side, an annular shield plate disposed to lie opposite to the lower side of a projected portion of the backing plate which is projected outward beyond an outer peripheral end of the target,
   wherein the backing plate has a bonding portion arranged to be protruded relative to the projected portion,
   wherein an inner peripheral edge portion of the shield plate is positioned in a first clearance between an extended portion of the target which is extended outward beyond the bonding portion in a state in which the target is kept bonded to the bonding portion, and the projected portion of the backing plate, the first clearance being positioned radially inside an outer peripheral end of the target,
   wherein a second clearance is present between the shield plate and the projected portion of the backing plate, and
   wherein a third clearance is present between the shield plate and the extended portion of the target.

2. The cathode assembly according to claim 1, wherein the shield plate is divisible into a plurality of portions.

3. The cathode assembly according to claim 1, wherein a length of a portion in which the extended portion of the target and the shield plate lie opposite to each other in an overlapped manner is above a thickness of the target.

4. The cathode assembly according to claim 1, wherein the inner peripheral edge portion of the shield plate is positioned, within the first clearance, in a position closer to the bonding portion than an intermediate point of the extended portion of the target.

5. The cathode assembly according to claim 1, wherein the length of the second clearance, and the length of the third clearance are set to a range of 0.5 mm through 2 mm, respectively.

* * * * *